Figure 1:
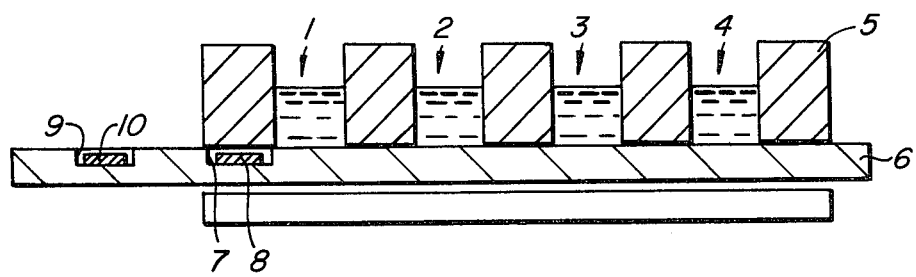

United States Patent [19] [11] 4,342,148
SpringThorpe et al. [45] Aug. 3, 1982

[54] CONTEMPORANEOUS FABRICATION OF DOUBLE HETEROSTRUCTURE LIGHT EMITTING DIODES AND LASER DIODES USING LIQUID PHASE EPITAXY

[75] Inventors: Anthony J. SpringThorpe, Richmond; Agnes Margittai, Ottawa, both of Canada

[73] Assignee: Northern Telecom Limited, Montreal, Canada

[21] Appl. No.: 231,501

[22] Filed: Feb. 4, 1981

[51] Int. Cl.³ .................................... H01L 21/208
[52] U.S. Cl. ................... 29/569 L; 29/576 E; 29/583; 148/171
[58] Field of Search ................ 148/171, 172, 173; 29/569 L, 576 E, 583

[56] References Cited
U.S. PATENT DOCUMENTS

| | | | |
|---|---|---|---|
| 4,023,993 | 5/1977 | Scifres et al. | 148/171 X |
| 4,045,749 | 8/1977 | Burnham et al. | 148/171 X |
| 4,072,544 | 2/1978 | DeWinter et al. | 148/171 |
| 4,073,676 | 2/1978 | Aiki et al. | 148/171X |
| 4,149,914 | 4/1979 | Weyrich et al. | 148/171 |
| 4,178,604 | 12/1979 | Nakamura et al. | 148/171 X |
| 4,184,170 | 1/1980 | Burnham et al. | 148/171 X |
| 4,184,171 | 1/1980 | Panish | 148/171 X |
| 4,233,090 | 11/1980 | Hawrylo et al. | 148/171 |
| 4,255,755 | 3/1981 | Itoh et al. | 148/171 X |
| 4,257,011 | 3/1981 | Nakamura et al. | 148/171 X |

Primary Examiner—G. Ozaki
Attorney, Agent, or Firm—Stuart L. Wilkinson

[57] ABSTRACT

In the manufacture of double heterostructure laser diodes using liquid phase epitaxy a source crystal precedes the laser substrate crystal through the process to ensure saturation of the various melts from which epitaxial growth is obtained. The source crystal has hitherto been discarded. The source crystal, since it immediately precedes the substrate crystal, also experiences epitaxial growth of a heterostructure but with heterostructure layer thicknesses unsuited for laser diode fabrication. By suitable processing of the source crystal after it is formed with a heterostructure, light emitting diodes can be produced so contributing to a 50% reduction in materials cost.

5 Claims, 3 Drawing Figures

U.S. Patent            Aug. 3, 1982            4,342,148

CONTEMPORANEOUS FABRICATION OF DOUBLE HETEROSTRUCTURE LIGHT EMITTING DIODES AND LASER DIODES USING LIQUID PHASE EPITAXY

The production by liquid phase epitaxy of crystals suitable for making double heterostructure (DH) light emitting diodes and lasers of, for example, the GaAlAs type is as follows.

Four solutions containing Ga, Al, As and an appropriate n-type or p-type dopant are contained in separate square wells machined into a high purity carbon block. the block is placed in a furnace to ensure a temperature constant to better than 0.5° C. across the four melts. An accurately machined carbon boat slides under the block and contacts the melts, the wells being open bottomed. The boat has spaced recesses in its top surface. One recess houses a source crystal of GaAs and the other recess houses a substrate crystal. The leading or source crystal is used only to ensure that epitaxial growth solutions within the wells are exactly saturated before the trailing or substrate crystal contacts them. The source crystal can be either a single crystal of GaAs or a slab of polycrystalline GaAs. The furnace is cooled during a growth cycle and the two crystals are advanced sequentially past the melts. A typical cooling rate is 0.3° C./min. The layer thicknesses are determined both by the composition of the melts and by the length of time that the substrate crystal spends in contact with each solution.

Typical thicknesses and compositions obtained during a normal layer deposition sequence are tabulated below:

| Layer | Growth Time (min) | Thickness ($\mu$m) | Growth Time (min) | Thickness ($\mu$m) |
|---|---|---|---|---|
| 1st Confining | 30 | 4.5 | 48 | 3 |
| Active | 0.5v | 0.2 | 30 | 3.0 |
| 2nd Confining | 15 | 1.3 | 0.5 | 0.25 |
| Capping | 10 | 1.6 | 15 | 2.0 |
| | SUBSTRATE CRYSTAL | | SOURCE CRYSTAL | |

Some variation in material composition, dopant concentration and layer thickness is permitted. From an LPE process viewpoint, the important distinction is that the laser active layer should be in the range 0.1 to 0.3 microns and the LED active layer be in the range 0.5 to 4 microns for optimal performance. Considering again the LPE process described above, it has been the practice in industrial preparation of LED and laser diode substrates to discard the sacrificial source crystal.

it has now been found that appreciable materials cost reduction can be obtained by using the source crystal to make LED's. LED's produced from the sacrificial source crystal are characterized by substantially the same light output as conventional LED's but because of their thicker active layers are generally slower.

Figures 2A, 2B:
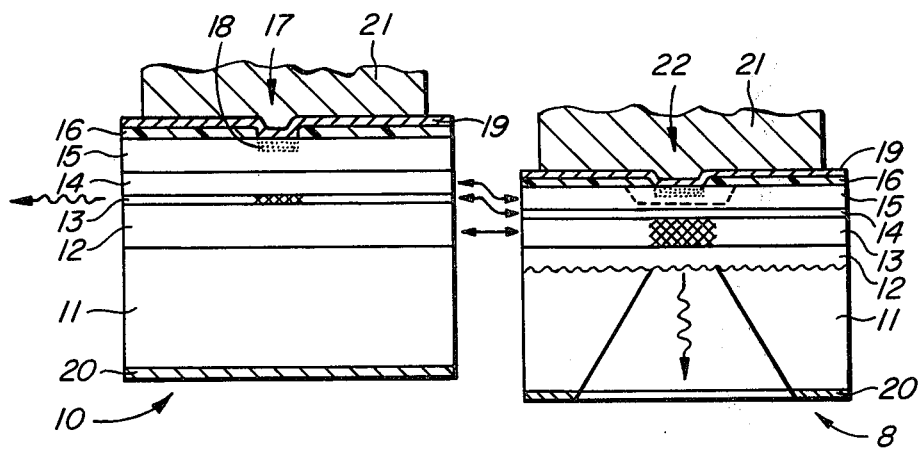

An embodiment of the invention will now be described by way of example with reference to the accompanying drawings in which:

FIG. 1 shows a schematic view of apparatus used in a liquid phase epitaxy (LPE) process according to the invention; and FIGS. 2a and 2b show sectional views of respectively a laser diode grown on a LPE substrate crystal and a light emitting diode (LED) contemporaneously grown on a LPE source crystal.

As described briefly in the introduction, and referring to FIG. 1, the various solutions for epitaxial crystal growth are contained in open-bottomed wells 1 to 4 in an accurately machined high purity carbon block 5. A boat 6 containing a housing 7 for a leading sacrificial source crystal 8 and a housing 9 for a trailing substrate crystal 10, slides under the block, the boat and the block in sealing contact except at the wells 1 to 4 where the melts contact the boat surface. Briefly, as the boat travels to the right in FIG. 1 the sacrificial source crystal 8 and then the trailing substrate crystal 10 are brought under successive wells. As the block 5 is cooled, epitaxial growth on the underlying crystals takes place.

The material in well 1 comprises a mixture of 10 g.Ga, 220 mg.GaAs, and 8 mg.Al doped with 0.6 mg.Te to render the material n-type. The well 2 contains a mixture of 10 g.Ga, 300 mg. GaAs and 1 mg Al doped with 25 mg.Ge. The well 3 contains a mixture of 10 g.Ga, 210 mg. GaAs and 8 mg. Al doped with 115 mg. Ge to render the material p-type. Lastly, the well 4 contains 10 g.Ga, 290 mg.GaAs, and 1 mg.Al with 75 mg.Ge to render the material p-type. The source and substrate crystals are n-type GaAs, the crystals being of the order of 75 microns in thickness.

The temperature of the block 5 is brought to about 780° C. in a furnace, the temperature range over the length of the block 5 being less than 0.5° C. The process is started by moving the boat in the direction of the arrow in FIG. 1 so that the source crystal underlies the layer 1 and the block is cooled at a rate of 0.3° C./min to promote epitaxial growth. The source crystal 8 is kept in this position for approximately 48 min. For part of this time the melt produces some etch-back of the source crystal surface until a temperature is reached at which epitaxial growth begins. The etch-back, incidentally, produces a rough interface between the substrate and the first confining layer as shown in FIG. 2b. This is beneficial for LED's since the roughness increases the light extraction from the crystal sources and hence increases external quantum efficiency. At the end of this growth period, the boat is moved to the right as shown in FIG. 1 so that the source crystal underlies well 2 and the substrate crystal underlies well 1. Epitaxial growth is allowed to proceed at the surface of both crystals and produces a 3 micron active layer 13 on the source crystal and a 4.5 micron first confining layer 12 on the substrate crystal 10 (FIG. 2a). At the end of this period the boat is moved to the right again so that the source crystal 8 underlies the third well and the substrate crystal 10 underlies well 2. Epitaxial growth is allowed to proceed for a short period of 30 seconds to produce a 0.25 micron second confining layer 14 on the source crystal and a 0.2 micron active layer 13 on the substrate crystal 10. Following this period, the boat is moved again to the right so that the source crystal underlies well 4 and the substrate crystal underlies well 3. Epitaxial growth is allowed to proceed for 15 minutes during which time a 2.0 micron capping layer 15 is grown on the source crystal and a 1.3 micron second confining layer 14 is grown on the substrate crystal 10. Finally the boat 5 is moved to the right again to bring the substrate crystal 10 under the well 4. Epitaxial growth is then allowed to proceed for 10 minutes during which time a 1.6 micron capping layer is grown on the substrate crystal.

As indicated previously, the source crystal 8 acts sacrificially to render the various melts saturated for subsequent growth of the substrate or laser crystal. However, because the source crystal contacts the successive melts under cooling conditions, a corresponding heterostructure is produced on the source crystal, albeit with completely different layer widths.

The source or LED crystal 8 and the substrate or laser crystal 10 are processed in a conventional manner to produce devices from the respective LPE grown chips. The devices produced are shown in cross section in FIGS. 2a (laser) and 2b (laser), the double ended arrows being indicative of simultaneously grown layers. Each of the devices illustrated has a substrate 11, a first confining layer 12, an active layer 13, a second confining layer 14, and a capping layer 15, the layers having been epitaxially grown as described previously.

To produce laser diodes from the substrate crystal, a passivating layer 16 of silicon dioxide is chemically vapour deposited over the crystal and stripe regions 17 are opened up using conventional photolithographic techniques and chemical etching. A zinc diffusion 18 is then performed on the exposed capping region stripe. Subsequently a contact layer of 70 Å chromium and 2000 Å gold shown as a layer 19 is evaporated on the surface of the chip, and a 200 Å layer 20 of Au/Ge eutectic and 2000 Å of gold is deposited on the lower surface of the chip. A gold heat sink 21 of 5–10 microns is then electroplated on the top surface. Lastly, the chip is cleaved into 250×375 micron pieces. The stripe contact defines the lasing cavity within the laser, the stripe region being of the order of 5×250 μm.

The structure illustrated in FIG. 2a represents one of the simplest laser structures. However, there are many different possible geometries based on the LPE grown heterostructure such as the buried layer heterostructure laser, the V-groove laser, junction stripe laser, transverse junction laser and the planar laser. All of these structures can use a double heterostructure of the type described previously and so can be produced contemporaneously with light emitting diodes.

The processing of the source chip to produce light emitting diodes is somewhat similar to the processing of the substrate chip. For a Burrus-type LED a passivating oxide layer 16 is deposited on the upper surface of the chip and windows 22, typically circular in shape and 25–75 microns in diameter, are opened up using photolithographic techniques. Again zinc diffusion 18 and ohmic contact deposition 19 takes place on the top surface and an ohmic contact deposition 20 is made on the bottom surface of the chip, followed by a 5–10 μm plated gold heat sink 21 on the top p-surface. The chip is then cleaved into individual LED's and appropriate leads soldered to top and bottom faces of the light emitting diode.

It will be seen that the capping layer is thicker than is usual for double heterostructure LED's produced in a standard or optimized LED production process. To reduce internal absorption of backwards emitted light in a Burrus LED structure, the crystal surface can be chemically etched (phantom line) to remove part of the capping layer before individual device fabrication. Edge emitting diodes are processed in a similar manner as will be understood by those skilled in the art of optoelectronic device fabrication.

Although the invention has been described in terms of the GaAlAs system, other binary, ternary and quaternary systems could be used; for example, the GaInAsP system.

In summary, it will be appreciated that by utilizing the hitherto discarded sacrificial source crystal from the laser fabrication process, LED's can be contemporaneously produced at a materials cost reduction of 50%.

What is claimed is:

1. A process for contemporaneously making double heterostructure light (LZD) emitting diodes and double heterostructure lasers using liquid phase epitaxy comprising:
   filling a first liquid phase epitaxy (LPE) reservoir with a liquid material having composition appropriate for growth therefrom of an epitaxial laser first confining layer;
   filling a second LPE reservoir with a liquid material having a composition appropriate for growth therefrom of an epitaxial laser active layer;
   filling a third LPE reservoir with a liquid material having a composition appropriate for growth therefrom of an epitaxial laser second confining layer;
   filling a fourth LPE reservoir with a liquid material having a composition appropriate for growth therefrom of an opitaxial laser capping layer;
   cooling a housing containing the reservoirs at a predetermined rate;
   moving a boat containing a leading source crystal and a trailing substrate crystal to a first station at which the source crystal underlies the first reservoir for sufficient time to saturate the composition in the first reservoir and to promote epitaxial growth of a first LED confining layer on the source crystal;
   moving the boat to a second station at which the substrate crystal underlies the first reservoir for sufficient time to promote epitaxial growth thereon of a laser first confining layer and the source crystal underlies the second reservoir and experiences epitaxial growth thereon of a LED active layer;
   moving the boat to a third station at which the substrate crystal underlies the second reservoir for sufficient time to promote epitaxial growth thereon of a laser active layer and the source crystal underlies the third reservoir and experiences epitaxial growth thereon of an LED second confining layer;
   moving the boat to a fourth station at which the substrate crystal underlies the third reservoir for sufficient time to promote epitaxial growth thereon of a laser second confining layer and the source crystal underlies the fourth reservoir and experiences epitaxial growth thereon of a LED capping layer;
   moving the boat to a fifth station at which the substrate crystal underlies the fourth reservoir for sufficient time to promote epitaxial growth thereon of a laser capping layer; and
   subsequently fabricating light emitting diodes from the source crystal and laser diodes from the substrate crystal.

2. A process as claimed in claim 1 wherein during a first part of the time that the source crystal underlies the first reservoir, etch back of the source crystal occurs to produce a roughened substrate surface and, during a remaining part of the time that the source crystal underlies the first reservoir, deposition of said first LED confining layer occurs.

3. A process as claimed in claim 1 wherein the subsequent fabrication of light emitting diodes from the source crystal includes the step of etching to reduce the thickness of the capping layer thereby to reduce internal light absorption.

4. A process as claimed in claim 1 wherein the subsequent fabrication of laser and light emitting diodes includes the steps of forming top and bottom electrical contacts on the crystal.

5. A process as claimed in claim 1 in which the subsequent fabrication of laser and light emitting diodes includes the step of cleaving the crystal to produce individual devices.

* * * * *